United States Patent [19]
Doran et al.

[11] Patent Number: 6,043,443
[45] Date of Patent: Mar. 28, 2000

[54] FABRICATION OF SEMICONDUCTOR DEVICES

[75] Inventors: Patrick J. Doran, Whitehall; James F. Dormer, Limekiln; Patrick J. Drummond, Hamburg; Daniel Kern, Sinking Spring, all of Pa.

[73] Assignee: Lucent Technologies Inc., Murray Hill, N.J.

[21] Appl. No.: 09/012,614

[22] Filed: Jan. 23, 1998

[51] Int. Cl.[7] ..................................................... B07C 5/344
[52] U.S. Cl. ........................... 209/573; 209/571; 209/936
[58] Field of Search ..................................... 209/571, 572, 209/573, 909, 936; 324/765, 158.1

[56] References Cited

U.S. PATENT DOCUMENTS

| | | | |
|---|---|---|---|
| 5,484,062 | 1/1996 | Rich | 209/936 |
| 5,534,786 | 7/1996 | Kaneko et al. | 324/765 |
| 5,686,834 | 11/1997 | Okudaira et al. | 324/158.1 |
| 5,788,084 | 8/1998 | Onishi et al. | 209/573 |
| 5,865,319 | 2/1999 | Okuda et al. | 209/573 |

*Primary Examiner*—Donald P. Walsh
*Assistant Examiner*—Daniel K. Schlak
*Attorney, Agent, or Firm*—Lester H. Birnbaum

[57] ABSTRACT

Disclosed is a method for fabricating devices so that several devices at a time can be tested and sorted. The devices are placed in a carrier so that each device occupies a discrete position. The carrier includes an identification marker, and each device is identified by its position in the carrier. The carrier is sent to multiple assembly and/or testing stations, and data for each device is collected and stored in a central data base according to its position in the carrier. Each device may then be sorted according to the collected data and its position in the carrier.

8 Claims, 3 Drawing Sheets

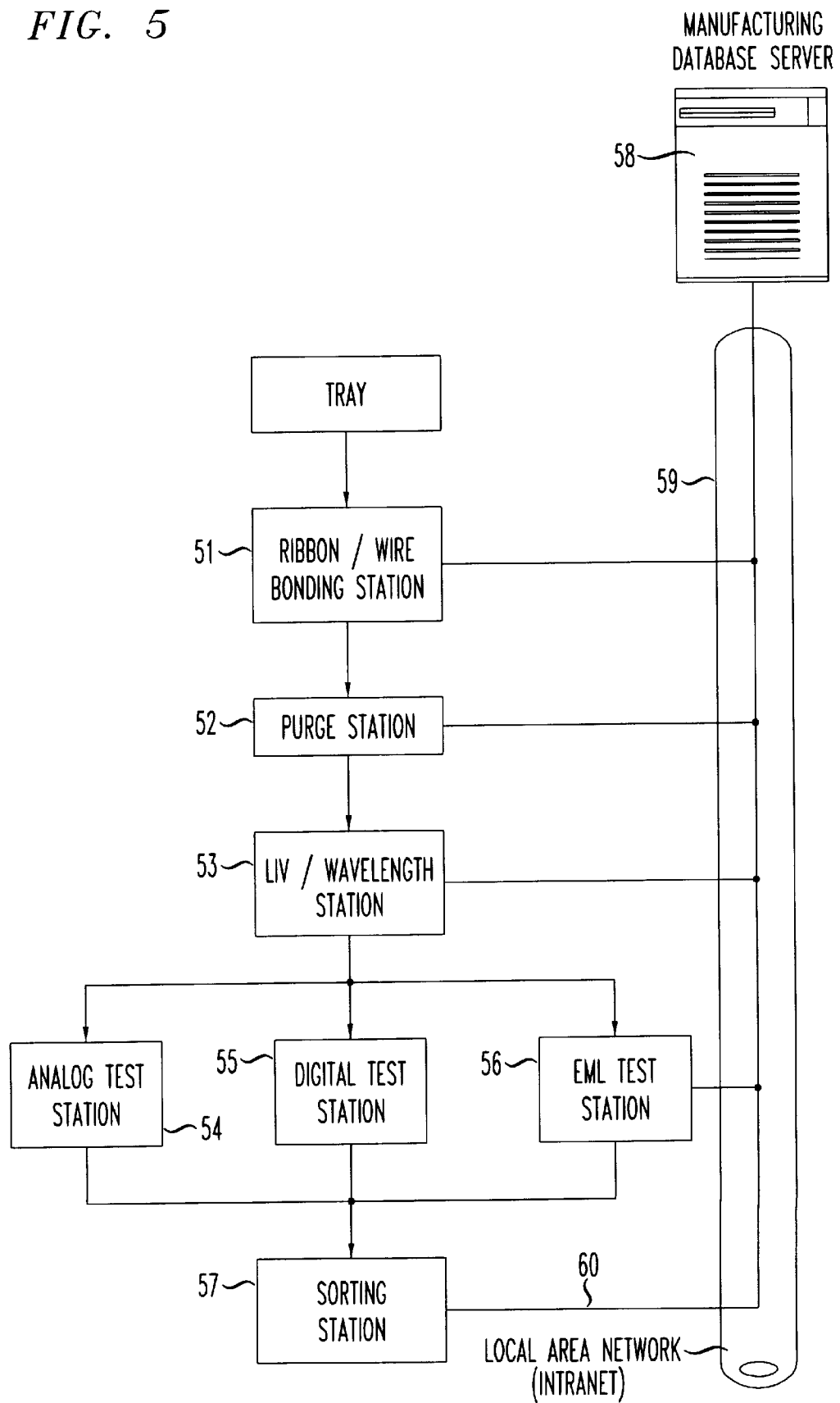

FABRICATION OF SEMICONDUCTOR DEVICES

FIELD OF THE INVENTION

This invention relates to the fabrication of semiconductor devices, and in particular, to a factory procedure for handling devices and accumulating data related to such devices.

BACKGROUND OF THE INVENTION

In the fabrication of discrete semiconductor devices, such as lasers, light emitting devices, and photodetectors, it is often necessary to perform a number of tests after assembling each device, and to characterize each device according to the results of the tests. For example, the tests could include a light-current-voltage(LIV) measurement, an accelerated aging measurement, and other tests depending upon the character and ultimate use of the device, e.g., Analog tests, Digital tests, and electrooptic modulator (EML) tests. Usually, each device is given its own identification marking and the devices are sent individually through each bonding and testing station.

While adequate, the individual testing, handling and correlation of test data of each device tends to be inefficient and can result in damage to individual devices during handling.

SUMMARY OF THE INVENTION

The invention is a method for fabricating semiconductor devices comprising the steps of providing a carrier which includes a plurality of discrete positions, and placing a plurality of such devices in the carrier so that each device occupies one of the discrete positions. The carrier is given an identification marker and each device is identified by its position in the carrier. The carrier is then sent through at least one testing station, and data is collected for each device based on its position in the carrier. The collected data can then be used as the basis for sorting the devices in the carrier.

BRIEF DESCRIPTION OF THE FIGURES

These and other features are delineated in detail in the following description. In the drawing:

FIG. 5 is a flow diagram illustrating a sequence of assembly and tests in according with an embodiment of the invention.

DETAILED DESCRIPTION

Figure 1:
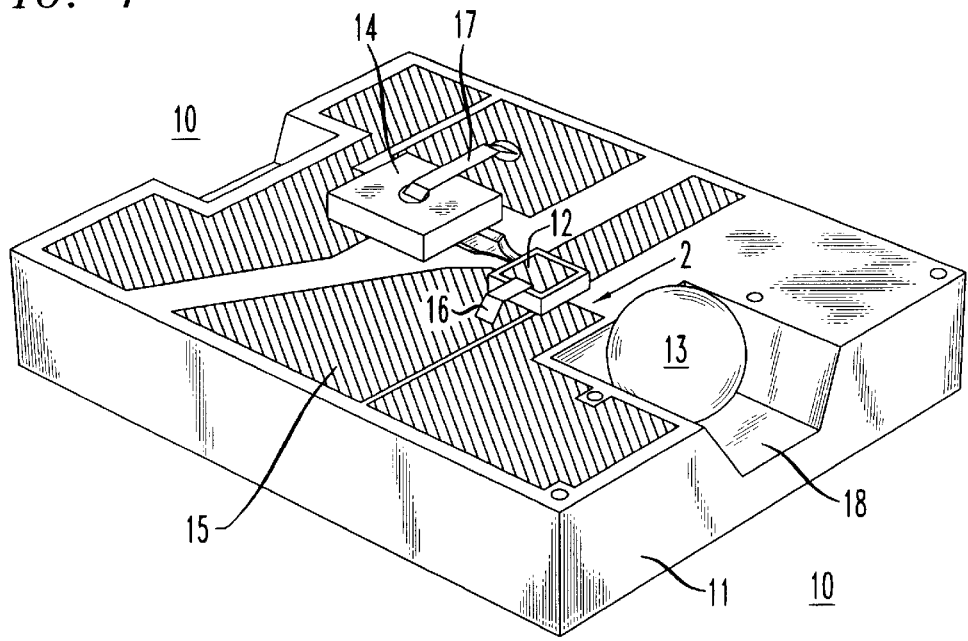
FIG. 1 is a perspective view of a semiconductor device which may be utilized with the present invention.

FIG. 1 illustrates a typical device which can be fabricated according to the invention. In this example, the device is an optical subassembly, 10, which includes a substrate, 11, such as silicon, which supports the various components. The substrate, 11, is typically cut to a size of 2.5 mm×3.5 mm and is approx. 35 mils thick. The semiconductor laser, 12, is mounted on the top surface of the substrate along with a PIN photodiode, 14, which acts as a back face monitor, and a spherical lens, 13, which is mounted in a cavity, 18, in the substrate, the lens focusing the light from the laser, 12. Metallization, e.g., 15, is also formed on the surface of the substrate to provide electrical connection to the laser, 12, and photodiode, 14, through wires or ribbons, 16 and 17, respectively. (For more details on the laser module, see, for example, U.S. patent application of Anigbo, Ser. No. 08/764960, filed Dec. 22, 1995.)

Figure 2:
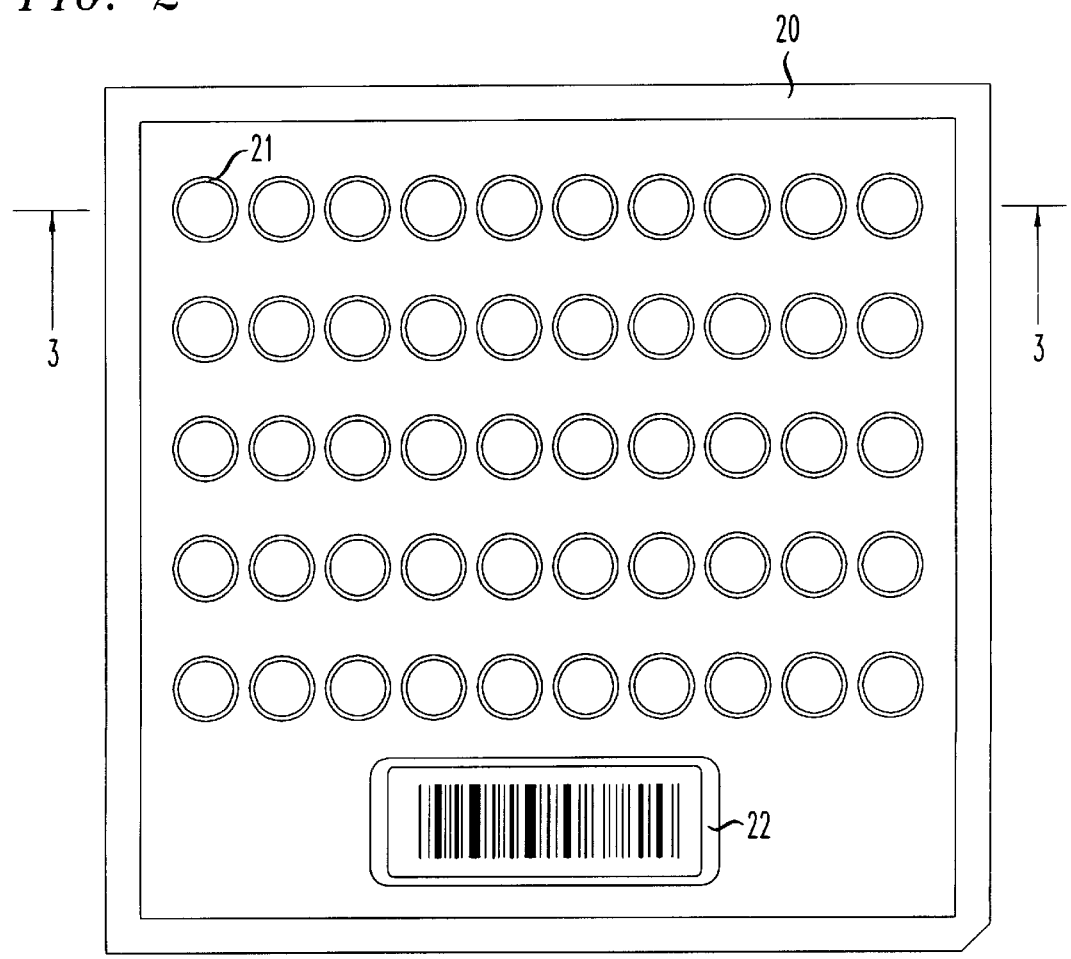
FIGS. 2 and 3 are top and side views, respectively, of a tray which is used in accordance with an embodiment of the invention.
Figure 3:
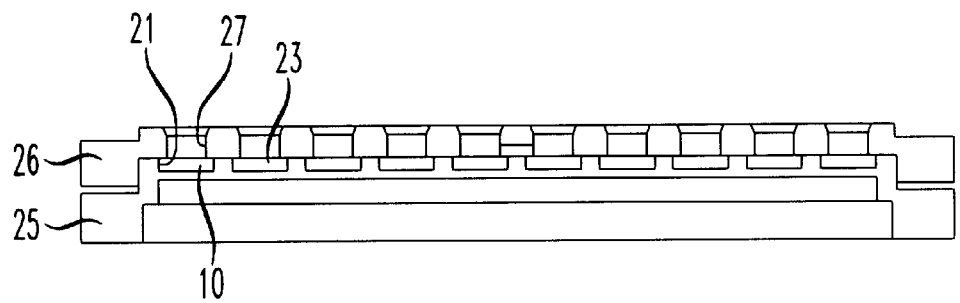
Figure 4:
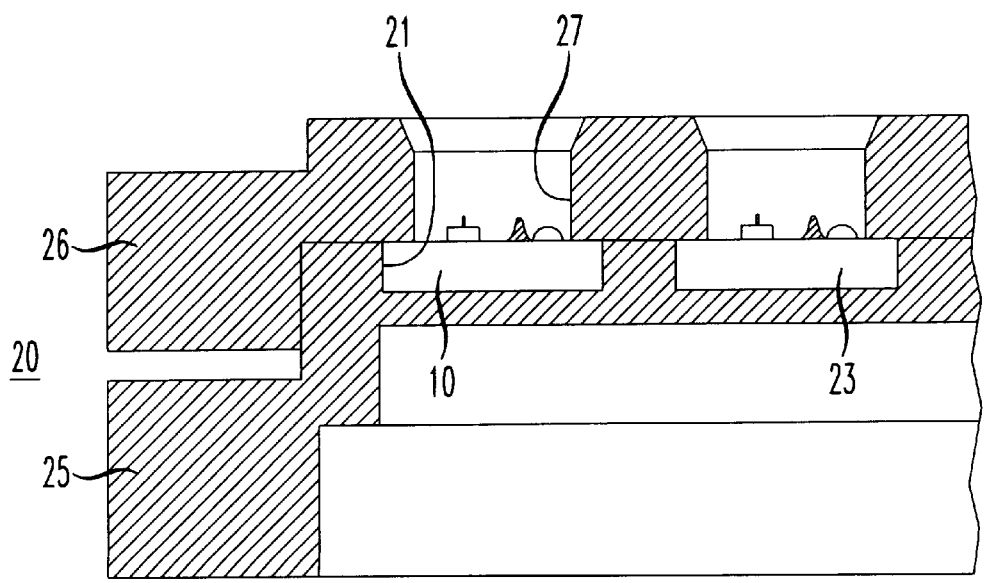
FIG. 4 is an enlarged view of a portion of the tray illustrated in FIG. 3.

In accordance with a feature of the invention, as illustrated in FIGS. 2–4, a tray, or carrier, 20, is provided. The tray or carrier, 20, typically comprises a base of metal material, 25, which includes an array of cavities, e.g., 21, formed in a major surface. In this example, the cavities are cylindrical, but they can be any convenient shape. The cavities are sized so that individual modules, e.g., 10, can be inserted into each cavity, e.g., 21, and remain essentially stationary therein during subsequent processing. In this example, the carrier includes five rows of ten cavities to process 50 modules at a time. Of course, any number of cavities could be employed. A cover, 26, typically made of plastic, is provided over the base, 25, in order to keep the devices in place. The cover, 26, includes an array of apertures, e.g., 27, which are aligned over corresponding cavities, e.g., 21, in the base.

The carrier also includes on its base or cover an identifying marker, 22, which in this example is a bar code, but could be a standard alphabetic and/or numeric sequence, or any type of marker which can be used to identify the carrier. Rather than provide identifying markers for each device, the devices, 10, are identified according to their position in the carrier, 20. Thus, for example, device, 10, is in position 1 in the carrier., while a device, 23, adjacent thereto would be in position 2, etc.

Advantageously, the base of the carrier, 20, is made of a material which provides protection from electrostatic discharge, such as aluminum.

The carrier, 20, with the devices positioned therein was then processed in accordance with the flow diagram illustrated in FIG. 5. At the first station, illustrated by block, 51, the laser, 12, and photodiode, 14, were bonded to the optical subassembly, 10, and the ribbons, 16 and 17 of FIG. 1, were bonded to the laser and photodiode, 12 and 14, respectively by use of a standard industry automatic wire bonder employing ultrasonic and thermosonic wedge bonding on a heated work stage. A visual inspection of the devices was then performed and any devices which were not properly bonded were indicated as failures in the manufacturing database so that no further tests were performed on the failed devices. The results of this first visual inspection were transmitted to a database server, 58, where the data for device testing was stored, by means of a link, 59, such as an intranet.

At the next station, illustrated by block 52, the devices in the carrier undergo an accelerated aging in order to determine the expected lifetime of each device. Product code results and testing parametric data results were transmitted to the server, 58, and the database server, 58, was updated as to the pass/fail status of each device.

At the next station, illustrated by block, 53, the devices in the carrier which maintained a pass status from the previous stations underwent standard light-current-voltage (LIV) and wavelength testing where a current was sent through each device and light output, current voltages and wavelengths were measured. Testing was done one device at a time from the carrier. Again, product code results and data from the LIV tests were sent to the central database in the server, 58, so that the status of each device could be updated, i.e., which devices in the carrier conformed to the product code specifications.

The carrier was then sent to one of three test stations depending upon what type of laser was included in the devices in the carrier. Carriers including lasers intended for analog applications, e.g., analog lasers, were sent to the Analog test station, illustrated by block, 54. There, each device in the carrier, was tested for its analog characteristics. Carriers including digital lasers, were sent to the digital test station, 55, where the devices were tested for their high frequency properties. Carriers including devices with electrooptic modulators were sent to the EML test station, 56, where the devices were tested for their high frequency and wavelength characteristics. Again, in order to save time, the test stations only test devices which have passed the testing in a previous test station, i.e., those positions in the carrier which have a "pass" in the data base stored in server, 58.

After the carrier had undergone one of the tests at station 54, 55, or 56, it was transported to a sorting station, illustrated by block, 57. There, each device was removed from the carrier and sorted according to the results from the combination of tests. This can be done robotically in response to the database stored in the server, 58, which communicates to the station, 57, over link 60. The server compares the results for each device to the product specifications to determine which category it should be sorted into. Only if the device fit within the product specifications for all tests was it categorized under that product code. The devices were then placed in a plastic carrier for further processing according to the sorting and testing operations. Any device which did not fall within a product specification was discarded.

While the invention has been illustrated in a process employing an assembly station, 51, and two testing stations, 53 and either 54,55, or 56, it will be appreciated that the invention is not so limited. It can be employed, for example, with any number of testing stations, including one and can be useful with or without an assembly station.

What is claimed is:

1. A method for testing semiconductor devices comprising the steps of:

providing a carrier which includes a plurality of discrete positions, the carrier including an identification marker;

placing a plurality of such devices in the carrier so that each device occupies one of the discrete positions and each device is identified by its position in the carrier;

sending the carrier through at least one testing station so that each device in the carrier is tested; and collecting data for each device from the test according to its position in the carrier.

2. The method according to claim 1 further comprising the step of sorting the devices according to the collected data.

3. The method according to claim 1 wherein the carrier comprises a metal body and the positions are defined by cavities in the body.

4. The method according to claim 1 wherein the devices comprise optoelectronic subassemblies.

5. The method according to claim 1 wherein the carrier is also sent through at least one assembly station prior to the testing station.

6. The method according to claim 5 wherein the assembly station is a bonding station.

7. The method according to claim 1 wherein the data is collected in a central data base in a server which is linked to the testing station.

8. The method according to claim 4 wherein the subassemblies are tested for light output and voltage.

* * * * *